United States Patent
Chien et al.

(10) Patent No.: US 9,543,343 B2
(45) Date of Patent: Jan. 10, 2017

(54) MECHANISMS FOR FORMING IMAGE SENSOR DEVICE

(71) Applicant: TAIWAN SEMICONDUCTOR MANUFACTURING CO., LTD., Hsin-Chu (TW)

(72) Inventors: Volume Chien, Tainan (TW); Yun-Wei Cheng, Taipei (TW); Shiu-Ko Jangjian, Tainan (TW); Zhe-Ju Liu, Pingzhen (TW); Kuo-Cheng Lee, Tainan (TW); Chi-Cherng Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 44 days.

(21) Appl. No.: 14/093,277

(22) Filed: Nov. 29, 2013

(65) Prior Publication Data

US 2015/0155320 A1 Jun. 4, 2015

(51) Int. Cl.
 *H01L 27/146* (2006.01)
 *H01L 31/0232* (2014.01)
 *H01L 31/0216* (2014.01)

(52) U.S. Cl.
 CPC ... *H01L 27/14623* (2013.01); *H01L 27/14621* (2013.01); *H01L 27/14625* (2013.01); *H01L 27/14629* (2013.01); *H01L 27/14685* (2013.01); *H01L 31/0232* (2013.01); *H01L 31/02164* (2013.01); *H01L 27/14627* (2013.01)

(58) Field of Classification Search
 CPC ........... H01L 27/1463; H01L 27/14603; H01L 27/14609; H01L 27/14623; H01L 27/14627; H01L 27/14629; H01L 27/14636; H01L 27/1464; H01L 17/14643; H01L 27/14683; H01L 27/14685; H01L 27/14689; H01L 31/0232; H01L 31/02164; H01L 27/14621; H01L 27/14625
 USPC .......................... 257/98, 290–294, E33.077, E31.121,257/E31.122
 See application file for complete search history.

(56) References Cited

U.S. PATENT DOCUMENTS

| | | | |
|---|---|---|---|
| 2002/0075391 A1* | 6/2002 | Shizukuishi | 348/319 |
| 2006/0163451 A1* | 7/2006 | Park | H01L 27/14621 250/208.1 |
| 2006/0275944 A1* | 12/2006 | Hyun | 438/70 |
| 2007/0114622 A1* | 5/2007 | Adkisson | H01L 21/76819 257/414 |
| 2010/0231775 A1* | 9/2010 | Suzuki | H01L 27/14818 348/311 |
| 2011/0058076 A1* | 3/2011 | Tanaka | H01L 27/14685 348/294 |
| 2012/0235266 A1* | 9/2012 | Ootsuka | H01L 27/14623 257/432 |

(Continued)

*Primary Examiner* — John P Dulka
(74) *Attorney, Agent, or Firm* — Birch, Stewart, Kolasch & Birch, LLP

(57) ABSTRACT

Embodiments of mechanisms for forming an image sensor device are provided. The image sensor device includes a semiconductor substrate and a photodetector in the semiconductor substrate. The image sensor device also includes a dielectric layer over the semiconductor substrate, and the dielectric layer has a recess aligned with the photodetector. The image sensor device further includes a filter in the recess of the dielectric layer. In addition, the image sensor device includes a shielding layer between the dielectric layer and the semiconductor substrate and surrounding the filter.

20 Claims, 5 Drawing Sheets

(56) References Cited

U.S. PATENT DOCUMENTS

2014/0264685 A1* 9/2014 Cheng .............. H01L 31/02327
257/432

* cited by examiner

MECHANISMS FOR FORMING IMAGE SENSOR DEVICE

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometry size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the intensity of the light is, the higher the charge is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
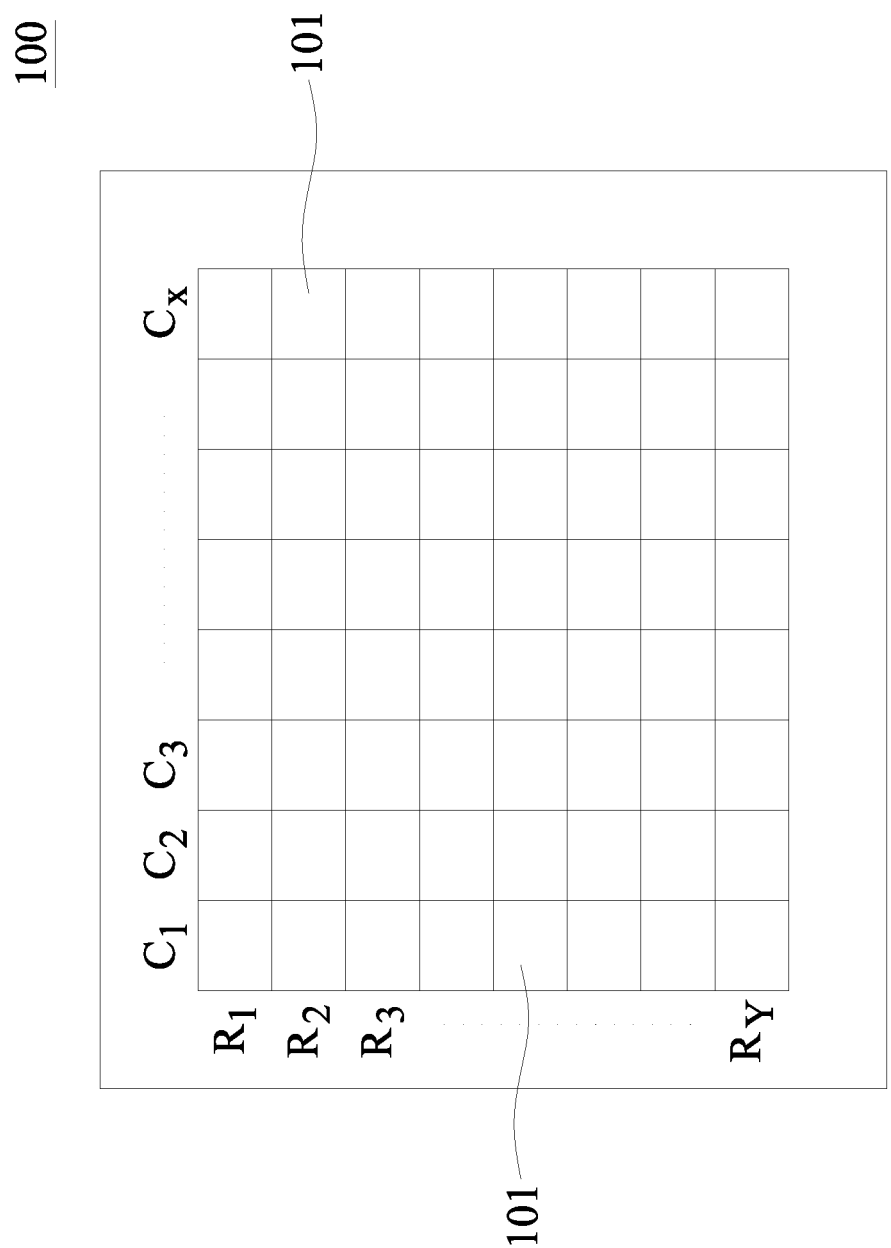
FIG. 1 is a top view of an image sensor device, in accordance with some embodiments.

FIG. 1 is a top view of an image sensor device 100, in accordance with some embodiments. The image sensor device 100 may be a backside illuminated (BSI) image sensor device. However, it should be appreciated that embodiments of the disclosure are not limited thereto. In some other embodiments, the image sensor device 100 is a front side illuminated (FSI) image sensor device.

In some embodiments, the image sensor device 100 includes an array of pixel regions 101. The pixel regions 101 may be arranged into a column (for example, $C_1$ to $C_X$) and a row (for example, $R_1$ to $R_Y$). The term "pixel region" refers to a unit cell containing features (for example, a photodetector and various circuitry). The unit cell may include various semiconductor devices for converting electromagnetic radiation into an electrical signal. Photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof.

The pixel regions 101 may be designed having various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region of the image sensor device 100 and be coupled to the pixel regions 101. The circuitry in the peripheral region provides an operation environment for the pixel regions 101 and support external communications with the pixel regions 101.

Figure 2:
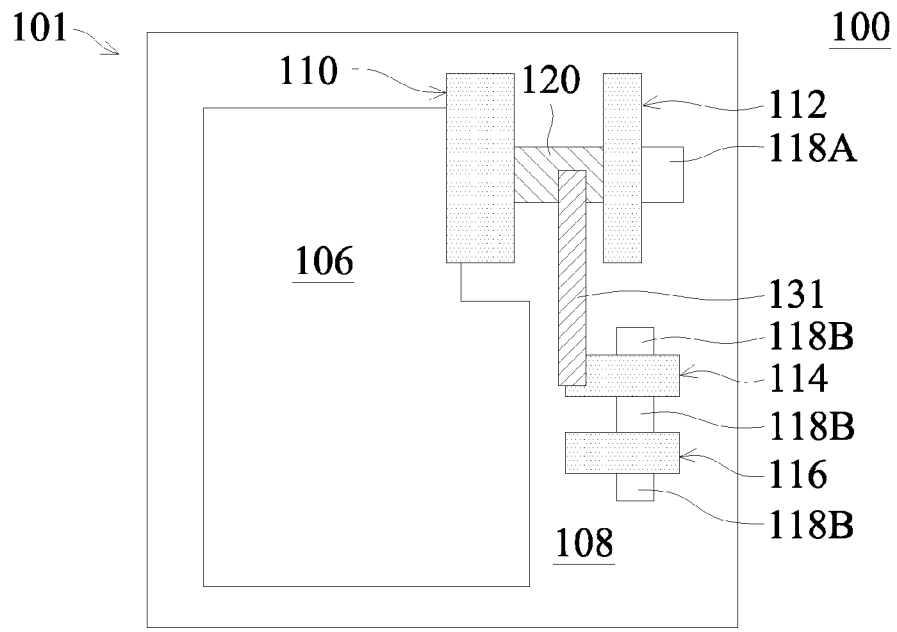
FIG. 2 is an enlarged top view of a pixel region in an image sensor device, in accordance with some embodiments.

FIG. 2 is an enlarged top view of one of the pixel regions 101 of the image sensor device 100 on a front surface of a semiconductor substrate (not illustrated in FIG. 2), in accordance with some embodiments. As shown in FIG. 2, the pixel region 101 includes a photodetector 106. In some embodiments, the photodetector 106 includes a photodiode for recording intensity or brightness of light (radiation). The pixel region 101 may contain various transistors. For example, the transistors include a transfer transistor 110, a reset transistor 112, a source-follower transistor 114, a select transistor 116, other suitable transistors, or a combination thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The image sensor device 100 may also include various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by a shallow trench isolation (STI) technique, a deep trench isolation (DTI) technique, other applicable techniques, or a combination thereof.

In some embodiments, the isolation structures 108 may include doped isolation structures formed by an implantation technique or diffusion technique. In some embodiments, the isolation structures 108 are formed in the pixel region 101 to isolate the photodetector 106, the transfer transistor 110, the reset transistor 112, the source-follower transistor 114, and the select transistor 116.

The image sensor device 100 further includes a color filter and a lens disposed over a back surface of the semiconductor substrate in some embodiments. The color filter and the lens may be aligned with the photodetector 106. The lens is used to direct or focus the incident light. The color filter is designed so that it filters through light of a predetermined wavelength band. For example, the color filter may filter through visible light of a red wavelength band, a green wavelength band, or a blue wavelength band to the photodetector 106.

In the operation of the image sensor device 100 according to some embodiments, the image sensor device 100 is designed to receive radiation traveling towards the back surface of the semiconductor substrate. The lens disposed over the back surface of the semiconductor substrate directs the incident radiation to the corresponding photodetector 106 in the semiconductor substrate. The incident radiation generates electron-hole pairs. When exposed to the incident radiation, the photodetector 106 responds to the incident radiation by accumulating electrons. The holes may be trapped by a doped layer over the back surface of the semiconductor substrate to prevent the recombination of the electrons and the holes.

The electrons are transferred from the photodetector 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is connected to a power supply to clear all accumulated electrons.

It should be appreciated that embodiments of the disclosure are not limited to being the image sensor device 100 shown in FIG. 1 or 2. In some other embodiments, the image sensor device 100 includes different configurations.

Figure 3:
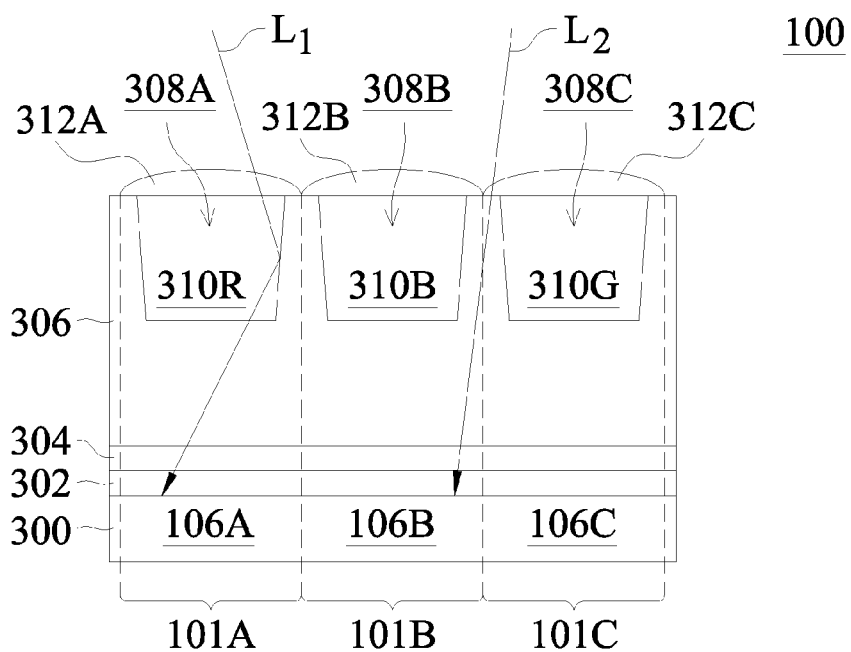
FIG. 3 is a cross-sectional view of an image sensor device, in accordance with some embodiments.

As mentioned above, the lens and the color filter are used to guide the incident light with particular wavelength band to the photodetector. FIG. 3 is a cross-sectional view of the image sensor device 100, in accordance with some embodiments.

As shown in FIG. 3, the image sensor device 100 includes a dielectric grid 306 over a semiconductor substrate 300 including one or more pixel regions 101A, 101B, and 101C, in accordance with some embodiments. Similar to the embodiments shown in FIG. 2, each of the pixel regions such as 101A, 101B, and 101C includes a photodetector formed in the semiconductor substrate 300. For example, the pixel regions 101A, 101B, and 101C include photodetectors 106A, 106B, and 106C, respectively. In some embodiments, the photodetectors 106A, 106B, and 106C include photodiodes having p-type and n-type doped regions formed in the semiconductor substrate 300.

As shown in FIG. 3, an anti-reflection coating (ARC) layer 302 and a buffer layer 304 are formed over a surface of the semiconductor substrate 300, in accordance with some embodiments. The ARC layer 302 is used to reduce optical reflection from the surface of the semiconductor substrate 300 to ensure that most of an incident light enters the photodetector and is sensed. The ARC layer 302 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof. The buffer layer 304 is used as a buffer between the ARC layer 302 and an overlying layer subsequently formed. The buffer layer 304 may be made of a dielectric material or other suitable materials. For example, the buffer layer 304 is made of silicon oxide, silicon nitride, silicon oxynitride, other applicable materials, or a combination thereof. In some embodiments, the ARC layer and/or the buffer layer are/is not used.

As shown in FIG. 3, the dielectric grid 306 is formed over the buffer layer 304, in accordance with some embodiments. The dielectric grid 306 includes multiple recesses such as recesses 308A, 308B, and 308C. In some embodiments, filters such as color filters 310R, 310B, and 310G are formed in the recesses 308A, 308B, and 308C, respectively. The color filters 310R, 310B, and 310G may be used to filter through a red wavelength band, a blue wavelength band, and a green wavelength band, respectively.

As shown in FIG. 3, lenses 312A, 312B, and 312C are respectively disposed or formed over the color filters 310R, 310B, and 310G, in accordance with some embodiments. The lenses 312A, 312B, and 312C are used to direct or focus the incident light. The lenses 312A, 312B, and 312C may include a microlens array. The lenses 312A, 312B, and 312C may be made of a high transmittance material. For example, the high transmittance material includes transparent polymer material (such as polymethylmethacrylate, PMMA), transparent ceramic material (such as glass), other applicable materials, or a combination thereof.

As shown in FIG. 3, an incident light $L_1$ is directed by the lens 312A and enters the color filter 310R in some embodiments. The incident light $L_1$ is reflected by the sidewall of the recess 308A and sensed by the photodetector 106A in the pixel region 101A. In some embodiments, the color filter 310R filters through visible light of a red wavelength band to the photodetector 106A.

However, in some cases, an incident light $L_2$ may enter the lens 312C and penetrate through the dielectric grid 306 to a neighboring photodetector 106B in the pixel region 101B. The incident light $L_2$ is not filtered by the color filter 310G and is sensed by the photodetector 106B but not by the photodetector 106C. The photodetector may therefore collect non-filtered signals and a crosstalk problem may occur. As a result, the performance and the reliability of the image sensor device 100 are lowered. Since the feature size continues to shrink, the problems mentioned above are exacerbated in some embodiments.

Therefore, it is desirable to find alternative mechanisms for forming an image sensor device to resolve or reduce the problems mentioned above. FIGS. 4A-4E are cross-sectional views of a process for forming an image sensor device 100', in accordance with some embodiments. The image sensor device 100' may have a configuration similar to the image sensor device 100 shown in FIGS. 1 and 2.

Figure 4A:
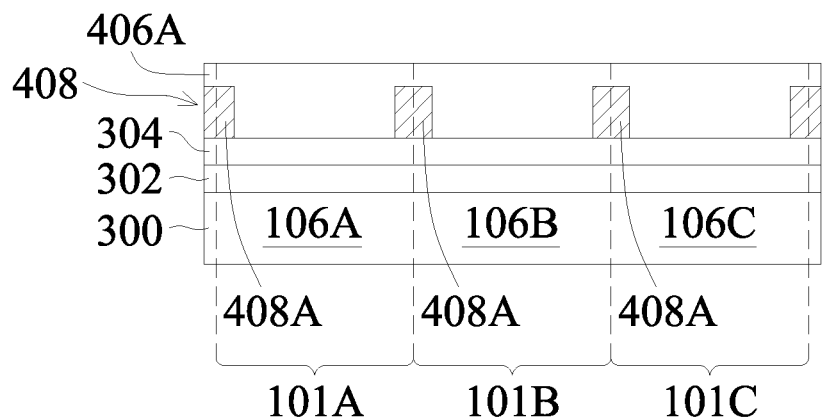
FIGS. 4A-4E are cross-sectional views of a process for forming an image sensor device, in accordance with some embodiments.

As shown in FIG. 4A, the semiconductor substrate 300 including the pixel regions 101A, 101B, and 101C are provided. The photodetectors 106A, 106B, and 106C are formed in the pixel regions 101A, 101B, and 101C, respectively.

The ARC layer 302 and the buffer layer 304 are formed over the semiconductor substrate 300, as shown in FIG. 4A. The ARC layer 302 and the buffer layer 304 may be deposited sequentially over the semiconductor substrate 300 using a chemical vapor deposition (CVD) process, spin-on process, physical vapor deposition (PVD) process, other applicable processes, or a combination thereof. In some other embodiments, however, one or both of the ARC layer 302 and the buffer layer 304 are not formed.

As shown in FIG. 4A, a reflective layer 408 is formed over the buffer layer 304, in accordance with some embodiments. The reflective layer 408 may include reflective elements 408A. Each of the reflective elements 408A is used to prevent the incident light from entering a neighboring pixel. The crosstalk problems between pixel regions are thus prevented or reduced.

In some embodiments, the reflective layer 408 is made of a reflective material such as a metal material. The reflective layer 408 may be made of aluminum, silver, copper, titanium, platinum, tungsten, tantalum, tantalum nitride, other suitable materials, or a combination thereof. In some embodiments, the reflective layer 408 is deposited over the buffer layer 304 using a suitable deposition process. The suitable process includes, for example, a PVD process, an electroplating process, a CVD process, other applicable processes, or a combination thereof. Afterwards, the reflective layer 408 is patterned using, for example, a photolithography process and an etching process to form the reflective elements 408A.

After the formation of the reflective layer 408, a dielectric layer 406A is deposited over the reflective layer 408 and the buffer layer 304, as shown in FIG. 4A in accordance with some embodiments. The dielectric layer 406A may be made of silicon oxide, silicon nitride, silicon oxynitride, or other suitable materials. CVD process or the like may be performed to form the dielectric layer 406A. In some embodiments, a planarization process is performed to provide a substantially planar top surface of the dielectric layer 406A. The planarization process may include a chemical mechanical polishing (CMP) process, a grinding process, an etching process, other applicable processes, or a combination thereof. In some embodiments, the dielectric layer 406A surrounds the reflective elements 408A, as shown in FIG. 4A.

Figure 4B:
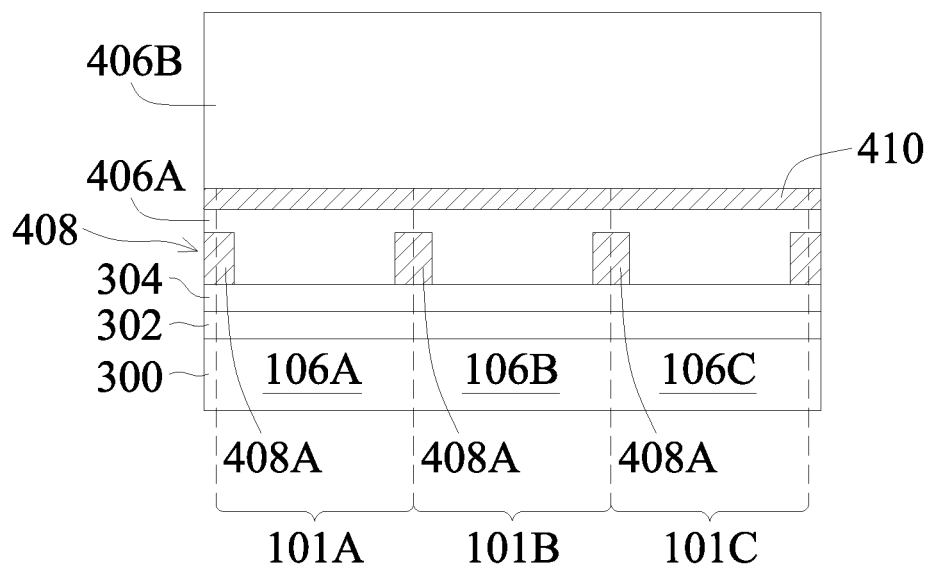

Afterwards, a shielding layer 410 is deposited over the dielectric layer 406A, as shown in FIG. 4B in accordance with some embodiments. The shielding layer 410 may be used to reflect and/or absorb the incident light. Therefore, the incident light is blocked from penetrating through the shielding layer 410. In some embodiments, the shielding layer 410 is configured to completely block the incident light. The transmittance of the shielding layer 410 may be in a range from about 0 to about 0.20.

In some embodiments, the shielding layer 410 is made of a metal material or a metal-containing material. The metal material or the metal-containing material includes, for example, aluminum, silver, copper, titanium, platinum, tungsten, tantalum, tantalum nitride, other suitable materials, or a combination thereof. In some embodiments, the shielding layer 410 and the reflective layer 408 are made of the same material. In some other embodiments, the shielding layer 410 and the reflective layer 408 are made of different materials.

Embodiments of the disclosure have many variations. In some embodiments, the shielding layer 410 is made of a semiconductor material. The semiconductor material may have high absorption of visible (and/or infrared) light. For example, the shielding layer 410 may be made of black silicon or other suitable semiconductor materials. The black silicon may include a needle-shaped surface structure where needles are made of single-crystal or polycrystal silicon. In some other embodiments, the shielding layer 410 may be made of a polymer material or a ceramic material capable of reflecting and/or absorbing the incident light.

The shielding layer 410 may be deposited over the dielectric layer 406A using a PVD process, CVD process, spin-on process, other suitable processes, or a combination thereof. In some embodiments, the shielding layer 410 is thinner than the reflective layer 408. The shielding layer 410 may have a thickness in a range from about 10 nm to about 500 nm. However, embodiments of the disclosure are not limited thereto. In some other embodiments, the shielding layer 410 is not thinner than the reflective layer 408. Alternatively, in some embodiments, the shielding layer 410 includes a stack of multiple layers. The multiple layers may be a number of the same layers. Alternatively, some or all of the multiple layers are different layers.

After the formation of the shielding layer 410, a dielectric layer 406B is deposited over the shielding layer 410, as shown in FIG. 4B in accordance with some embodiments. In some embodiments, the materials of the dielectric layer 406B and the shielding layer 410 are different from each other. The dielectric layer 406B may be made of silicon oxide, silicon nitride, silicon oxynitride, other suitable materials, or a combination thereof. The dielectric layer 406B may be deposited using a CVD process, a spin-on process, a PVD process, other applicable processes, or a combination thereof. In some embodiments, the materials of the dielectric layers 406B and 406A are the same. In some other embodiments, the materials of the dielectric layers 406B and 406A are different from each other. The dielectric layer 406B may have a thickness larger than that of the dielectric layer 406A. In some embodiments, a planarization process is performed on the dielectric layer 406B to provide a substantially planar top surface of the dielectric layer 406B. The planarization process includes, for example, a CMP process, a grinding process, an etching process, other applicable processes, or a combination thereof.

Figure 4C:
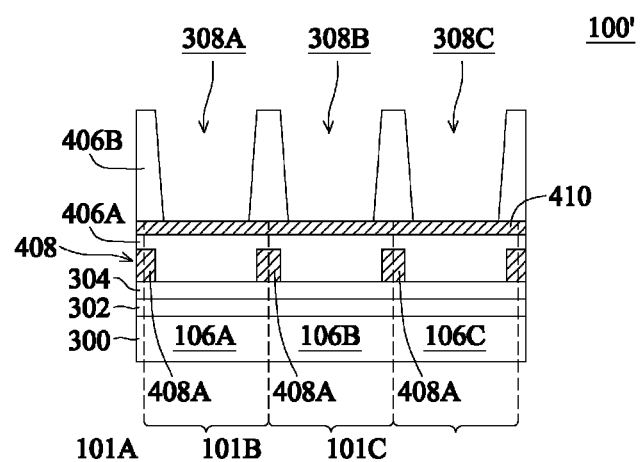

As shown in FIG. 4C, the dielectric layer 406B is partially removed to form the recesses 308A, 308B, and 308C, in accordance with some embodiments. In some embodiments, a photolithography process and an etching process are performed to form the recesses 308A, 308B, and 308C. The shielding layer 410 may also function as an etch stop layer in the etching process for forming the recesses 308A, 308B, and 308C. As shown in FIG. 4C, the shielding layer 410 is exposed by the recesses 308A, 308B, and 308C.

Figure 4D:
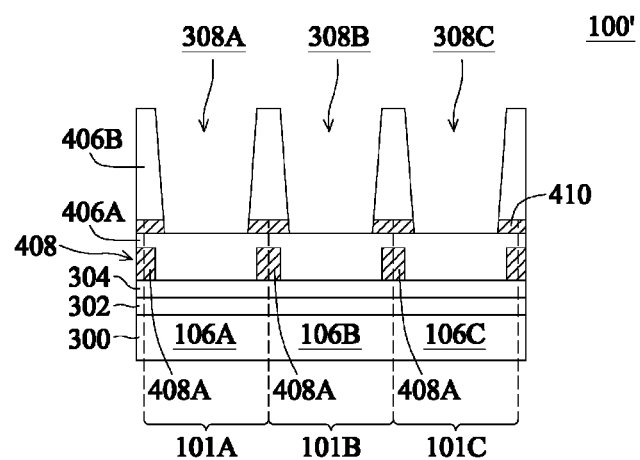

Afterwards, the exposed portions of the shielding layer 410 are removed such that the recesses 308A, 308B, and 308C expose the dielectric layer 406A, as shown in FIG. 4D in accordance with some embodiments. An etching process may be performed to remove the exposed portion of the shielding layer 410. As a result, a dielectric grid constructed by the patterned dielectric layer 406B is formed, as shown in FIG. 4D. In some embodiments, each of the recesses 308A, 308B, and 308C is aligned with the photodetectors 106A, 106B, and 106C, respectively.

Figure 4E:
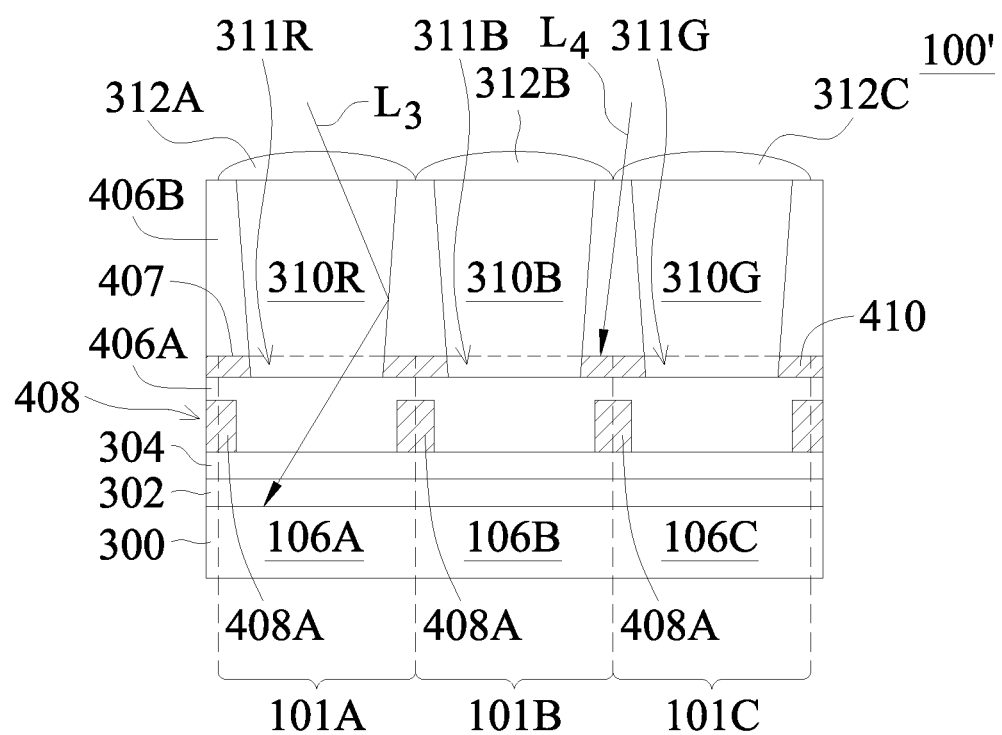

As shown in FIG. 4E, filters such as the color filters 310R, 310B, and 310G are respectively formed in the recesses of the dielectric layer 406B (or dielectric grid), in accordance with some embodiments. As shown in FIG. 4E, the shielding layer 410 surrounds the color filters 310R, 310B, and 310G. The color filters 310R, 310B, and 310G may be made of a dye-based polymer (or a pigment-based polymer). In some embodiments, a first filter film is deposited over the dielectric layer 406B to fill the recesses 308A, 308B, and 308C using, for example, a spin-on process or other applicable processes. The first filter film may also be a photoresist layer. Therefore, exposure and development operations may then be performed to pattern the first filter film such that the first filter film remains in one of the recesses, such as the recess 308A. As a result, the color filter 310R is formed. Similarly, the color filters 310B and 310G may be formed sequentially by using similar methods.

In some embodiments, the color filters 310R, 310B, and 310G have protruding portions 311R, 311B, and 311G, respectively. Each of the protruding portions 311R, 311B, and 311G protrudes from a bottom surface 407 of the dielectric layer 406B. The protruding portions 311R, 311B, and 311G are surrounded by the shielding layer 410, as shown in FIG. 4E in accordance with some embodiments. In some embodiments, a bottom of the shielding layer 410 is substantially coplanar with bottoms of the color filters 310R, 310B, and 310G, as shown in FIG. 4E.

After the formation of the color filters, the lenses 312A, 312B, and 312C are respectively formed over the color filters 310R, 310B, 310G, as shown in FIG. 4E in accordance with some embodiments. As shown in FIG. 4E, an incident light $L_3$ is directed by the lens 312A and enters the color filter 310R in some embodiments. The incident light $L_3$ is reflected by the sidewall of the recess 308A and sensed by the photodetector 106A in the pixel region 101A. An incident light $L_4$, similar to the incident light $L_2$ shown in FIG. 3, is blocked by the shielding layer 410 from entering the pixel region 101B adjacent to the pixel region 101C. Therefore, substantially no non-filtered signals are sensed by the photodetectors. The crosstalk problem is also prevented or significantly reduced. The performance and reliability of the image sensor device 100' are improved.

Embodiments of mechanisms for forming an image sensor device are provided. A shielding layer is formed between color filters of the image sensor device. Due to the shielding layer, substantially no non-filtered signals enter the photodetectors, and the crosstalk problem is prevented or significantly reduced. The yield and performance of the image sensor device are therefore improved.

In accordance with some embodiments, an image sensor device is provided. The image sensor device includes a semiconductor substrate and a photodetector in the semiconductor substrate. The image sensor device also includes a dielectric layer over the semiconductor substrate, and the dielectric layer has a recess aligned with the photodetector. The image sensor device further includes a filter in the recess of the dielectric layer. In addition, the image sensor device includes a shielding layer between the dielectric layer and the semiconductor substrate and surrounding the filter.

In accordance with some embodiments, an image sensor device is provided. The image sensor device includes a semiconductor substrate having a first pixel region and a second pixel region. The image sensor device also includes a first photodetector and a second photodetector in the first pixel region and the second pixel region, respectively. The image sensor device further includes a dielectric layer over the semiconductor substrate, and the dielectric layer has a first recess and a second recess aligned with the first photodetector and the second photodetector, respectively. In addition, the image sensor device includes a first filter and a second filter in the first recess and the second recess, respectively. The image sensor device also includes a shielding layer between the dielectric layer and the semiconductor substrate and surrounding the first filter and the second filter.

In accordance with some embodiments, a method for forming an image sensor device is provided. The method includes forming a photodetector in a semiconductor substrate and forming a shielding layer over the semiconductor substrate. The method also includes forming a dielectric layer over the shielding layer and partially removing the dielectric layer to form a recess. The method further includes partially removing the shielding layer through the recess and forming a filter in the recess after the shielding layer is partially removed.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image sensor device, comprising:
a semiconductor substrate;
a photodetector in the semiconductor substrate;
a dielectric layer over the semiconductor substrate, wherein the dielectric layer has a recess aligned with the photodetector;
a filter in the recess of the dielectric layer, wherein the filter has a protruding portion protruding from a bottom surface of the dielectric layer;
a shielding layer between the dielectric layer and the semiconductor substrate and surrounding the filter, wherein the filter and the shielding layer overlap from a view facing a direction perpendicular to a normal direction of a top surface of the semiconductor substrate, and the shielding layer surrounds the protruding portion of the filter; and a reflective element directly below the shielding layer, wherein the shielding layer is thinner than the reflective element.

2. The image sensor device as claimed in claim 1, wherein a bottom of the shielding layer is substantially coplanar with a bottom of the filter.

3. The image sensor device as claimed in claim 1, wherein the shielding layer comprises a metal material.

4. The image sensor device as claimed in claim 1, further comprising a lens over the photodetector.

5. The image sensor device as claimed in claim 1, further comprising an anti-reflection layer between the semiconductor substrate and the shielding layer.

6. The image sensor device as claimed in claim 1, further comprising:
   a second dielectric layer surrounding the reflective element, wherein the second dielectric layer is between the semiconductor substrate and the dielectric layer.

7. The image sensor device as claimed in claim 6, wherein materials of the reflective element and the shielding layer are the same.

8. The image sensor device as claimed in claim 6, further comprising:
   a black level correction region in the semiconductor substrate; and
   a shielding element over the black level correction region, wherein materials of the shielding element and the reflective element are the same.

9. An image sensor device, comprising:
   a semiconductor substrate having a first pixel region and a second pixel region;
   a first photodetector and a second photodetector in the first pixel region and the second pixel region, respectively;
   a dielectric layer over the semiconductor substrate, wherein the dielectric layer has a first recess and a second recess aligned with the first photodetector and the second photodetector, respectively;
   a first filter and a second filter in the first recess and the second recess, respectively, wherein the first filter has a protruding portion protruding from a bottom surface of the dielectric layer;
   a shielding layer between the dielectric layer and the semiconductor substrate and surrounding the first filter and the second filter, wherein the first filter and the shielding layer overlap from a view facing a direction perpendicular to a normal direction of a top surface of the semiconductor substrate, and the shielding layer surrounds the protruding portion of the first filter; and
   a reflective element directly below the shielding layer, wherein the shielding layer is thinner than the reflective element.

10. The image sensor device as claimed in claim 9, wherein the second filter has a second protruding portion protruding from a bottom surface of the dielectric layer, and the shielding layer surrounds the second protruding portion of the second filter.

11. The image sensor device as claimed in claim 9, wherein a bottom of the shielding layer is substantially coplanar with bottoms of the first filter and the second filter.

12. The image sensor device as claimed in claim 9, wherein the shielding layer comprises a metal material, a polymer material, a semiconductor material, a ceramic material, or a combination thereof.

13. The image sensor device as claimed in claim 9, wherein a thickness of the shielding layer is in a range from about 10 nm to about 500 nm.

14. An image sensor device, comprising:
   a semiconductor substrate;
   a photodetector in the semiconductor substrate;
   a filter over the semiconductor substrate and aligned with the photodetector;
   a dielectric layer over the semiconductor substrate and surrounding the filter;
   a shielding layer over the semiconductor substrate and surrounding a lower portion of the filter, wherein the lower portion of the filter protrudes from a bottom surface of the dielectric layer, and the shielding layer and the lower portion of the filter overlap from a view facing a direction perpendicular to a normal direction of a top surface of the semiconductor substrate; and
   a reflective element directly below the shielding layer, wherein the shielding layer is thinner than the reflective element.

15. The image sensor device as claimed in claim 14, wherein bottoms of the shielding layer and the filter are substantially coplanar with each other.

16. The image sensor device as claimed in claim 14, wherein the shielding layer comprises a metal material.

17. The image sensor device as claimed in claim 14, further comprising:
   a second dielectric layer surrounding the reflective element, wherein the second dielectric layer is between the semiconductor substrate and the filter.

18. The image sensor device as claimed in claim 17, wherein materials of the shielding layer and the reflective element are substantially the same.

19. The image device as claimed in claim 1, wherein the reflective element is separated from the shielding layer.

20. The image device as claimed in claim 1, wherein the shielding layer is wider than the reflective element.

* * * * *